(12) United States Patent
Lee et al.

(10) Patent No.: US 6,927,997 B2
(45) Date of Patent: Aug. 9, 2005

(54) 3-TRANSISTOR OTP ROM USING CMOS GATE OXIDE ANTIFUSE

(75) Inventors: Kwyro Lee, Daejeon (KR); Jinbong Kim, Daejeon (KR); Hyouk-Kyu Cha, Seongnam-si (KR)

(73) Assignee: Korea Advance Institute of Science and Technology, Daejeon (KR)

( * ) Notice: Subject to any disclaimer, the term of this patent is extended or adjusted under 35 U.S.C. 154(b) by 0 days.

(21) Appl. No.: 10/866,251

(22) Filed: Jun. 14, 2004

(65) Prior Publication Data

US 2005/0007855 A1 Jan. 13, 2005

(30) Foreign Application Priority Data

Jun. 28, 2003 (KR) ................................ 10-2003-0042986

(51) Int. Cl.$^7$ .............................................. G11C 11/34
(52) U.S. Cl. ...................... 365/177; 365/96; 365/225.7
(58) Field of Search ........................... 365/94, 96, 177, 365/187, 104, 225.7

(56) References Cited

U.S. PATENT DOCUMENTS

| | | | | |
|---|---|---|---|---|
| 5,748,025 A | * | 5/1998 | Ng et al. ..................... | 327/333 |
| 6,191,641 B1 | * | 2/2001 | Devanney .................... | 327/525 |
| 6,650,167 B1 | * | 11/2003 | Benzer et al. ............... | 327/333 |

OTHER PUBLICATIONS

Jinbong Kim and Kwryo Lee, 3–Transister Antifuse OTP ROM Array using Standard CMOS Process, 2003 Symposium on VLSI Circuits Digest of Technical Papers, Jun. 14, 2003, pp. 239–242.

* cited by examiner

*Primary Examiner*—Van Thu Nguyen
*Assistant Examiner*—Hien Nguyen
(74) *Attorney, Agent, or Firm*—Shinjyu Globall IP Counselors, LLP (57) ABSTRACT

The present invention relates to an OTP ROM using a CMOS gate oxide antifuse. According to an embodiment of the present invention, in an OTP ROM cell having a first input terminal, a second input terminal and a third input terminal, wherein the OTP ROM stores data by means of a voltage applied to the first to third input terminals, the OTP ROM cell includes a cell access transistor having a gate and drain forming the second input terminal and a source forming the first input terminal, wherein the cell access transistor is activated by a voltage applied to between the gate and source, a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor, and an antifuse transistor having a gate forming the third input terminal, and source and drain both of which are connected to each other and are then connected to the drain of the high-voltage blocking transistor, wherein a high voltage is applied to the third input terminal and if the cell access transistor is activated, gate oxide is broken and shorted.

40 Claims, 9 Drawing Sheets

3-TRANSISTOR OTP ROM USING CMOS GATE OXIDE ANTIFUSE

BACKGROUND OF THE INVENTION

1. Field of the Invention

The present invention relates to a semiconductor memory device, and more particularly, to an OTP (One-Time Programmable) ROM using a CMOS gate oxide antifuse.

2. Background of the Related Art

In fabricating a CMOS OTP nonvolatile memory, an antifuse device has been widely used. The antifuse is the opposite of a regular fuse. The antifuse is electrically an "open circuit" in a normal state, but becomes a "short circuit" if an insulator is broken through application of a high voltage, if necessary. An OTP ROM can be implemented with these two states.

A device used as an antifuse is mainly a metal-oxide-metal. Recently, there has been proposed a structure in which an Oxide-Nitride-Oxide (ONO) capacitor used in DRAM process is used as the antifuse. These structures, however, had a difficulty in implementation as follows and a problem in that the properties of the antifuse are poor.

Firstly, the above schemes required additional process in the existing standard CMOS process. Additional processes such as metal conductors, for example tungsten, aluminum, a dual-poly structure, ONO, etc, as both end electrodes of the antifuse are required.

Secondly, since it is difficult to uniformly control the thickness of an insulator through the process, it is also difficult to obtain uniform breakdown properties. Accordingly, there is a problem that a variation in a programming voltage of the antifuse is high.

Lastly, an existing ONO structure uses the antifuse of a capacitor type and has a complicate control circuit. Thus, there is a disadvantage that a large area per unit cell is needed.

For the above reasons, in fabricating a DRAM, an OTP ROM was implemented by using a process that allows for additional ONO or adding an additional process to an existing standard CMOS process. Furthermore, its applicable fields are limited to the recovery of defective memory cells having only several bit capacity.

As conventional technology for solving the aforementioned problems, there has been proposed a drift-nMOS antifuse as an antifuse OTP ROM that can be implemented with only the standard CMOS process.

The drift-nMOS antifuse is composed of an antifuse employing an n-well, n+-poly and gate oxide, and a drift-nMOS for blocking a high voltage. This structure, however, also has disadvantages that it requires an additional mask in the existing standard CMOS process and occupies a large area since one n-well per bit is used.

SUMMARY OF THE INVENTION

Accordingly, the present invention has been made in view of the above problems, and it is an object of the present invention to provide an OTP ROM that can be implemented without additional process in a standard CMOS process.

Another object of the present invention is to provide an OTP ROM having uniform breakdown voltage properties.

Further another object of the present invention is to provide an OTP ROM that can be implemented with only a low-voltage device without an additional process for providing a high voltage.

Yet another object of the present invention is to provide an OTP ROM that can be higher integrated using an array structure.

To achieve the above objects, according to a first embodiment of the present invention, in an OTP ROM cell having a first input terminal, a second input terminal and a third input terminal, wherein the OTP ROM stores data by means of a voltage applied to the first to third input terminals, the OTP ROM cell includes a cell access transistor having a gate forming the second input terminal, a drain and a source forming the first input terminal, wherein the cell access transistor is activated by a voltage applied to between the gate and the source; a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and an antifuse transistor having a gate forming the third input terminal, and source and drain which are connected to each other and are then connected to the drain of the high-voltage blocking transistor, wherein a high voltage is applied to the third input terminal and if the cell access transistor is activated, gate oxide is broken and shorted.

According to a second embodiment of the present invention, in an OTP ROM cell having a first input terminal, a second input terminal and a third input terminal, wherein the OTP ROM stores data by means of a voltage applied to the first to third input terminals, the OTP ROM cell includes a cell access transistor having a gate forming the second input terminal, a drain and a source forming the first input terminal, wherein the cell access transistor is activated by a voltage applied to between the gate and the source; a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and an antifuse transistor having a gate forming the third input terminal, a drain and a source, one of the source and the drain being connected to the drain of the high-voltage blocking transistor and the other of the source and the drain being floated, wherein a high voltage is applied to the third input terminal and if the cell access transistor is activated, gate oxide is broken and shorted.

According to a third embodiment of the present invention, in an OTP ROM cell having a first input terminal, a second input terminal and a third input terminal, wherein the OTP ROM stores data by means of a voltage applied to the first to third input terminals, the OTP ROM cell includes a cell access transistor having a gate forming the second input terminal, a drain and a source forming the first input terminal, wherein the cell access transistor is activated by a voltage applied to between the gate and the source; a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and an antifuse transistor having a gate connected to the drain of the high-voltage blocking transistor, and a source and a drain which are connected to each other to form the third input terminal, wherein a high voltage is applied to the third input terminal and if the cell access transistor is activated, gate oxide is broken and shorted.

According to a fourth embodiment of the present invention, in an OTP ROM cell having a first input terminal, a second input terminal and a third input terminal, wherein the OTP ROM stores data by means of a voltage applied to the first to third input terminals, the OTP ROM cell includes a cell access transistor having a gate forming the second input terminal, a drain and a source forming the first input terminal, wherein the cell access transistor is activated by a voltage applied to between the gate and source; a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and an antifuse transistor having a gate connected to the drain of the high-voltage blocking transistor, a drain and a source, one of the source and drain forming the third input terminal and the other of the source and drain being floated, wherein a high voltage is applied to the third input terminal and if the cell access transistor is activated, gate oxide is broken and shorted.

In the OTP ROM cell according to the first and second embodiments of the present invention, the antifuse transistor is implemented with an nMOS transistor.

In the OTP ROM cell according to the third and fourth embodiments of the present invention, the antifuse transistor is implemented with a pMOS transistor.

In the OTP ROM cell according to the first to fourth embodiments of the present invention, a sense amplifier for sensing the current flowing into the first input terminal may be further included.

In the OTP ROM cell according to the first to fourth embodiments of the present invention, a power supply input unit for applying a high voltage when data is stored and applying a common operating voltage when recorded data is read, is connected to the third input terminal.

In the OTP ROM cell according to the first to fourth embodiments of the present invention, a bias circuit for applying a voltage higher than a common operating voltage when data is stored and applying the common operating voltage when recorded data is read, is connected to the gate of the high-voltage blocking transistor.

In the OTP ROM cell according to the first to fourth embodiments of the present invention, the bias circuit comprises a transistor, and first and second resistors, wherein a voltage for activating the transistor is applied to a gate of the transistor if data is stored in the OTP ROM cell, a drain of the transistor is connected to one end of the second resistor, a source of the transistor is grounded, the other end of the second resistor is connected to one end of the first resistor to form an output terminal, and the other end of the first resistor is connected to the power supply.

An OTP ROM according to an embodiment of the present invention, wherein an OTP ROM cell according to the first to fourth embodiments is used in plural to form an array structure, wherein a first input terminal of the OTP ROM cell is connected to a bit line, a second input terminal of the OTP ROM cell is connected to a word line, a third input terminal of the OTP ROM cell is connected to a power supply input terminal for applying a high voltage or a common operating voltage, whereby a voltage applied to the bit line, the word line, and the power supply input terminal is controlled to store data or read stored data.

In the OTP ROM according to an embodiment of the present invention, a blocking resistor connected between the third input terminal and the power supply input terminal may be further included.

In the OTP ROM according to an embodiment of the present invention, a mode control and current sensor connected to the bit line, for controlling a value applied to the bit line according to a mode control signal and a bit line select signal applied thereto and sensing whether the current flows into the bit line if stored data is read, may be further included.

In the OTP ROM according to an embodiment of the present invention, the mode control and current sensor includes a bit-line data write unit for applying a proper voltage to a selected bit line if data is stored, an write enabler for activating the bit-line data write unit according to the bit line select signal and the mode, control signal, if data is stored, a bit-line sense amplifier for sensing the current flowing into the bit line if data is read, and a sense amp enabler for activating the bit-line sense amplifier according to the bit line select signal and the mode control signal, if data is read.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with preferred embodiments with reference to the accompanying drawings.

Figure 1:
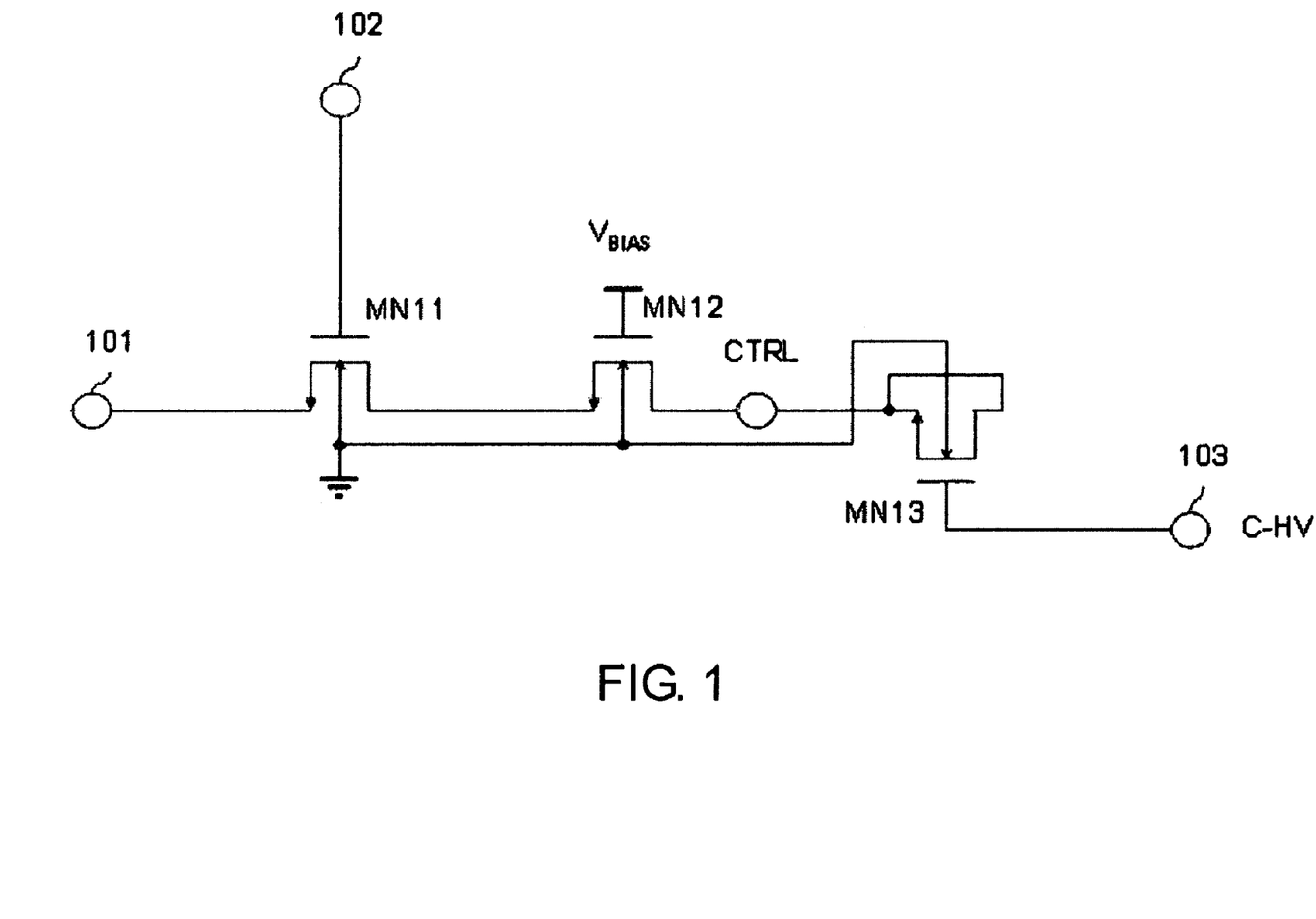
FIG. 1 is a circuit diagram showing the construction of a 3-transistor OTP ROM cell according to an embodiment of the present invention.

FIG. 1 is a circuit diagram showing the construction of a 3-transistor OTP ROM cell according to an embodiment of the present invention.

Referring to FIG. 1, the OTP ROM cell according to an embodiment of the present invention includes three input terminals 101 to 103 and three nMOSFET devices MN11 to MN13.

The interconnection relationship among the components will now be described.

The first NMOS transistor MN11 has a gate for forming the second input terminal 102, and a drain connected to a source of the second NMOS transistor MN12. Also, the source of the first NMOS transistor MN11 forms the first input terminal 101. The second NMOS transistor MN12 has a gate to which a bias voltage $V_{BIAS}$ is applied and a drain connected to a control terminal CTRL of the third NMOS transistor MN13. A gate of the third NMOS transistor MN13 forms a common high voltage terminal C-HV, and Drain and source terminals of the third NMOS transistor MN13 are connected to each other, thus forming the control terminal CTRL. The common high voltage terminal C-HV of the third NMOS transistor MN13 forms the third input terminal 103.

Hereinafter, the operation of the 3-transistor OTP ROM cell according to an embodiment of the present invention will be described.

The first NMOS transistor MN11 is a cell access transistor. The cell access transistors accesses a corresponding cell when storing data in an OTP ROM cell or reading data from the cell.

The second NMOS transistor MN12 is a high-voltage blocking transistor. This transistor serves to block a high voltage from being directly applied to the first NMOS transistor MN11, preventing malfunction of the OTP ROM cell.

The third NMOS transistor MN13 is an antifuse transistor whose on/off time is decided depending on a voltage applied between the control terminal CTRL and the common high voltage terminal C-HV. More particularly, if a high voltage is applied between the control terminal CTRL and the common high voltage terminal C-HV, a breakdown condition that gate oxide of the third NMOS transistor MN13 is broken occurs. In this case, the third NMOS transistor MN13 has a characteristic similar to a resistor. At this time, the resistor has approximately several KΩ.

In the 3-transistor OTP ROM cell according to an embodiment of the present invention, a logical state 0 or a logical state 1 is written depending on a case where the gate oxide of the third NMOS transistor MN13 being the antifuse transistor is broken or unbroken. Hereinafter, a procedure in which data are recorded in a ROM by applying a high voltage to the third input terminal 103 is referred to as a "PGM (Programming) mode" and a procedure in which data value stored in the ROM is read out is referred to as a "READ mode".

The operation in the PGM mode will be first described.

In the PGM mode, a common high voltage C-HV is applied to the third input terminal 103, and a common operating voltage $V_{DD}$ is applied or not applied to the first and second input terminals 101 and 102. Hereinafter, a case where the common operating voltage $V_{DD}$ is applied to the first and second input terminals 101 and 102 is referred to as "apply a logical state 1". A case where the voltage is not applied to them, i.e., the first and second input terminals 101 and 102 are grounded is referred to as "apply a logical state 0".

In the case where the antifuse transistor MN13 is broken, logical states 0 and 1 are applied to the first and second input terminals 101 and 102, respectively. In this case, the first NMOS transistor MN11 become conductive and a high voltage is applied between the control terminal CTRL of the antifuse transistor MN13 and the common high voltage terminal C-HV. Thus breakdown condition occurs.

In the case where the antifuse transistor MN13 is unbroken, a logical state 0 is applied to both the first and second input terminals 101 and 102, or logical states 1 and 0 or logical state 1 and 1 are applied to the first and second input terminals 101 and 102, respectively. In this case, since the first NMOS transistor MN11 of the cell access transistor is turned off, it is prevented that a high voltage is applied to the antifuse transistor MN13.

By controlling the voltage applied to the first to third input terminals 101 and 103 as such, the 3-transistor OTP ROM can be selectively programmed.

The operation in the READ mode will now be described.

In the READ mode, the common operating voltage $V_{DD}$ is applied to the second and third input terminals 102 and 103, and the current flowing into the first input terminal 101 is sensed, so that data stored in the OTP ROM cell can be read.

More particularly, if the antifuse transistor MN13 is broken, the antifuse transistor MN13 is turned on and the current thus flows from the antifuse transistor MN13 to the cell access transistor MN11. Therefore, predetermined current is sensed in the first input terminal 101. On the contrary, if the antifuse transistor MN13 is unbroken, the current does not flow into the first input terminal 101 since the antifuse transistor MN13 is turned off. Accordingly, it is possible to read data stored in the OTP ROM cell by sensing the current flowing into the first input terminal 101.

In the above description, the common high voltage C-HV is a voltage to the extent that it can break the antifuse transistor MN13. For instance, the voltage can be 6.5V. Furthermore, the common operating voltage $V_{DD}$ is a value that makes the NMOS transistor operating in a saturation region. For example, the value may be about 2V.

Figure 2:
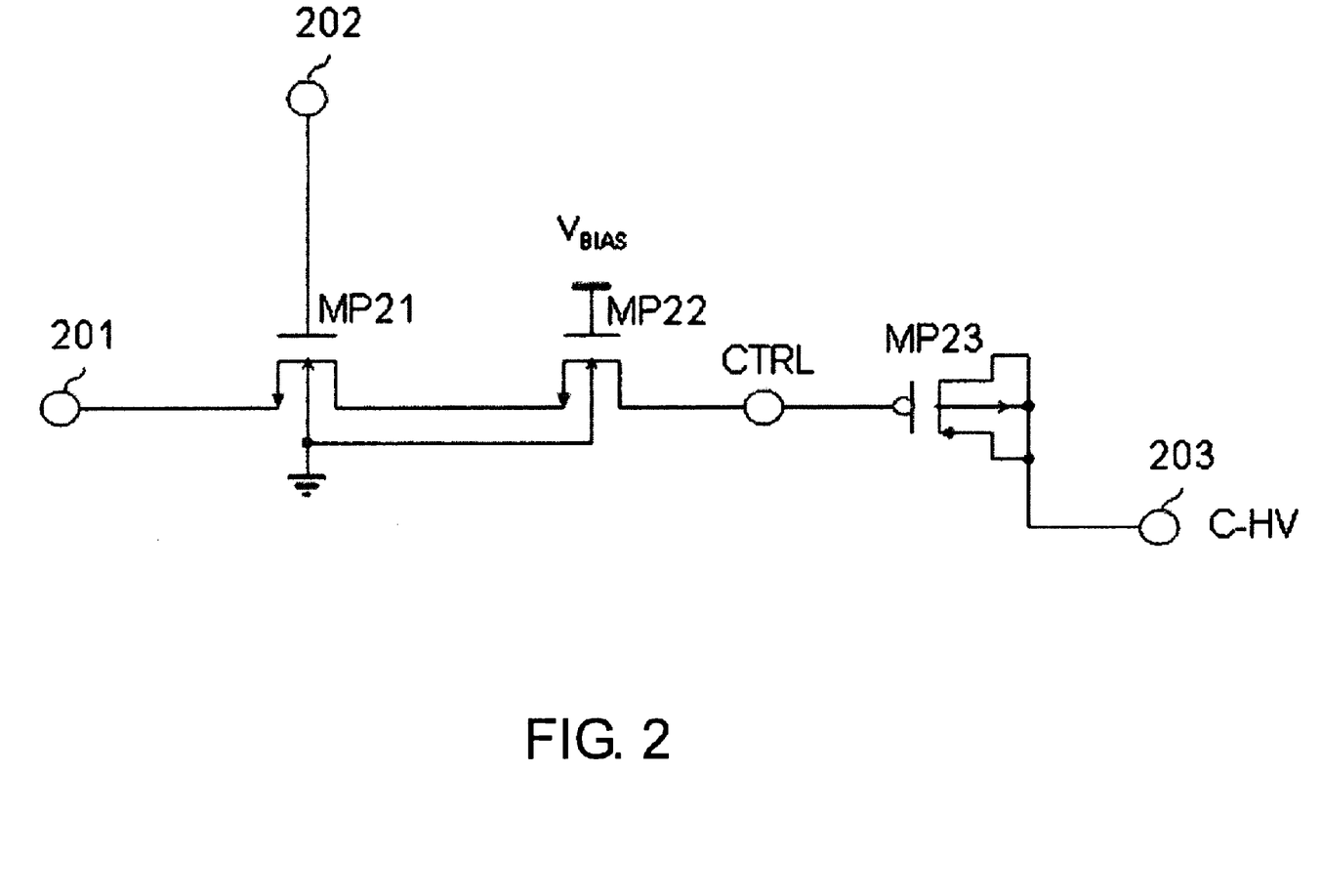
FIG. 2 is a circuit diagram showing the construction of a 3-transistor OTP ROM cell according to another embodiment of the present invention.

Although it has been shown in FIG. 1 that the antifuse transistor MN13 is implemented with the NMOS transistor, the present invention is not limited to it. As shown in FIG. 2, the antifuse transistor MN13 can be implemented with a PMOS transistor MN23. Furthermore, it will be evident to those skilled in the art that the cell access transistor and the high-voltage blocking transistor can be implemented with a PMOS transistor.

In the case where the PMOS transistor is used as the antifuse transistor MN23, the gate of the antifuse transistor MN23 is connected to the control terminal CTRL and the source and drain of the antifuse transistor MN23 is connected to the common high voltage terminal C-HV, as shown in FIG. 2.

Figure 3:
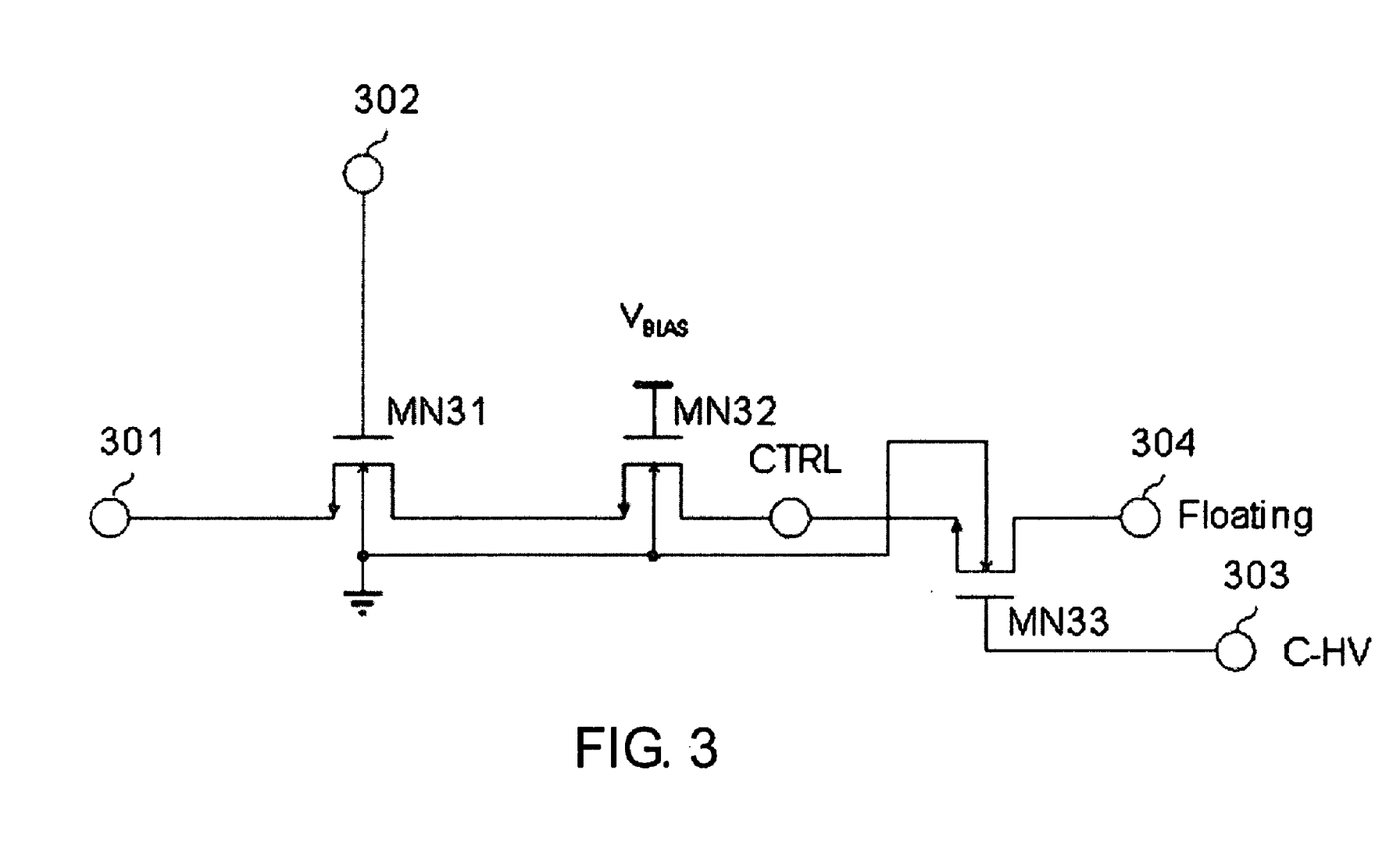
FIG. 3 is a circuit diagram showing the construction of a 3-transistor OTP ROM cell according to further another embodiment of the present invention.

Furthermore, as shown in FIG. 3, the 3-transistor OTP ROM cell can be formed by making the source or drain of the antifuse transistor MN33 floated.

Even in the case where the drain of the antifuse transistor MN33 is floated, a voltage difference between the source and drain of the antifuse transistor MN33 in the PGM mode is substantially the same. Thus, the 3-transistor OTP ROM cell can perform the similar operation as the case where the source and drain of the antifuse transistor MN33 are directly connected. Through this construction, there is an advantage that a ROM cell to be designed can be implemented with a small area. That is, as a region where the source and drain of the antifuse transistor MN23 are connected is not required, there is an effect that an area of about 10% per cell can be saved.

Figure 4:
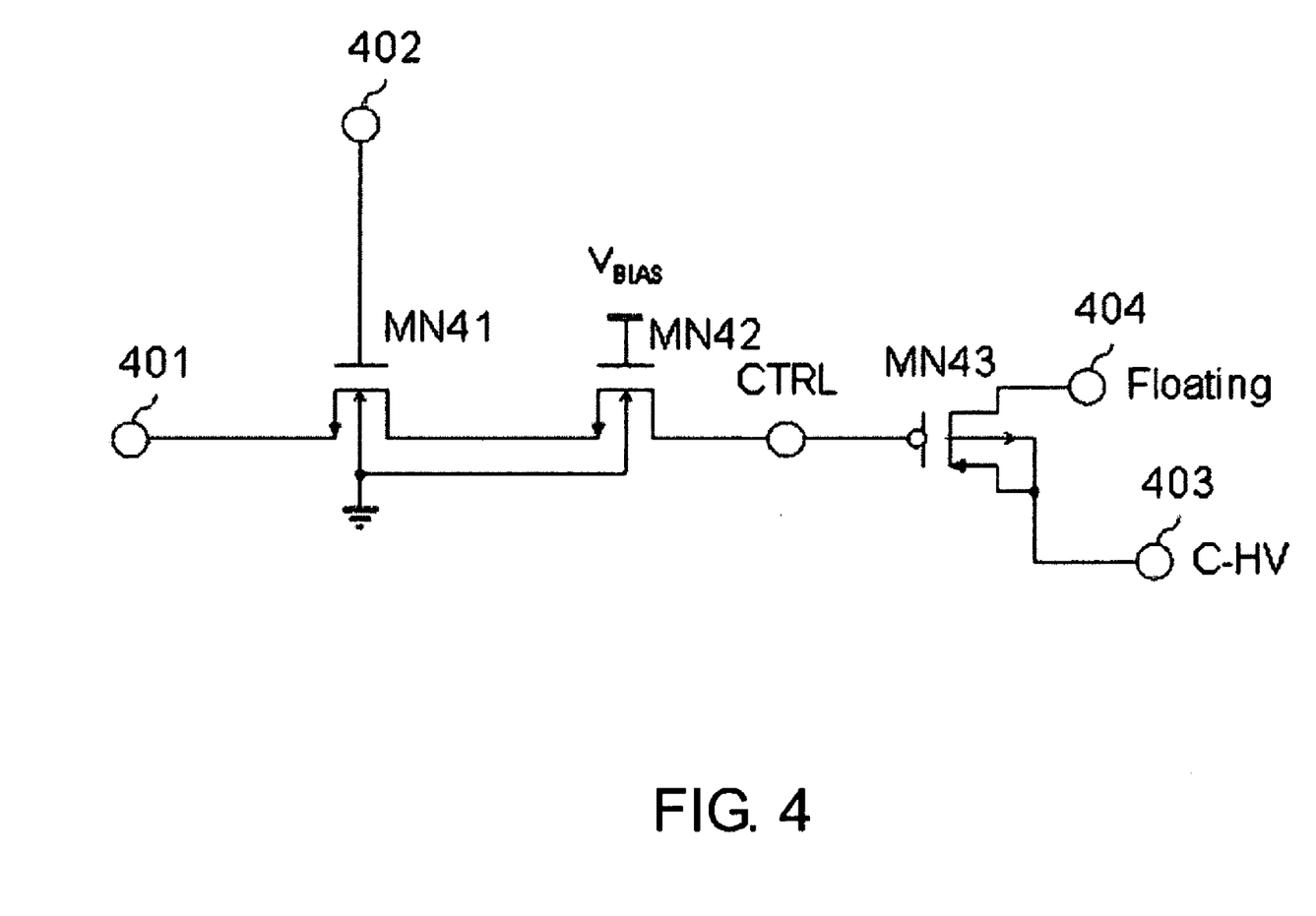
FIG. 4 is a circuit diagram showing the construction of a 3-transistor OTP ROM cell according to further another embodiment of the present invention.

FIG. 4 shows an embodiment that the source or drain of the antifuse transistor MN43 is floated if the antifuse transistor MN43 is implemented with the PMOS transistor. Detailed explanation on the construction of FIG. 4 will be omitted in order to avoid redundancy with the description of FIG. 2 and FIG. 3.

Figure 5:
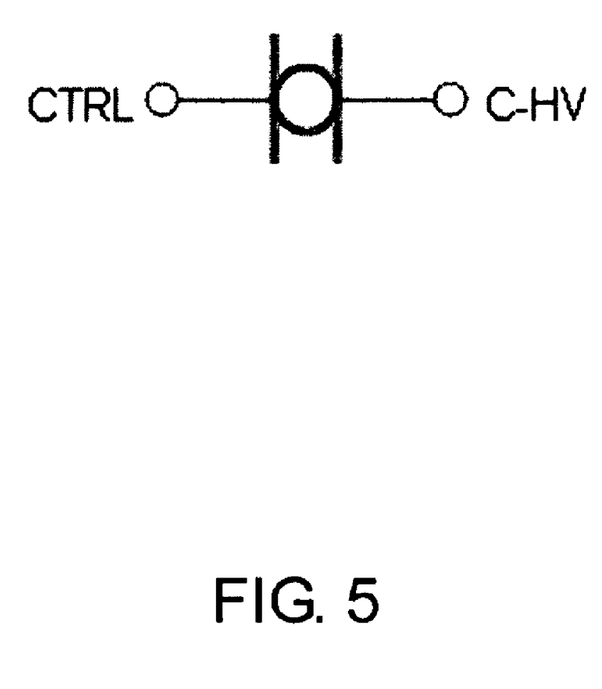
FIG. 5 shows a symbol representing an antifuse transistor shown in FIG. 1 to FIG. 4.

FIG. 5 shows a symbol representing the antifuse transistor shown in FIG. 1 to FIG. 4 in order to explain the structure of the OTP ROM according to an embodiment of the present invention.

Referring to FIG. 5, the antifuse transistor includes a control terminal CTRL and a common high voltage terminal C-HV. The antifuse transistor is broken, shorted or opened by means of the voltage applied between the control terminal CTRL and the high voltage terminal C-HV.

Figure 6:
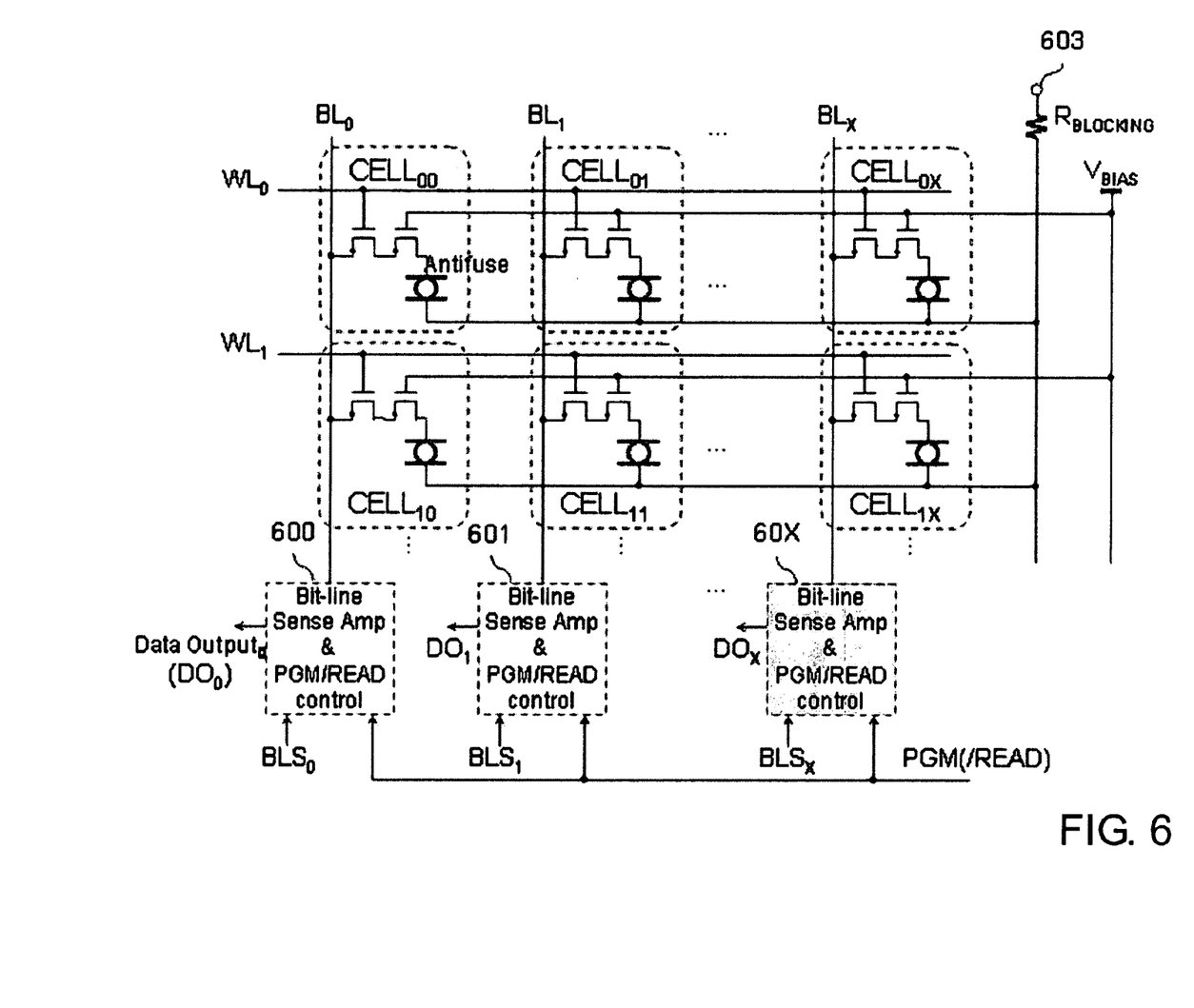
FIG. 6 is a circuit diagram showing the construction of an OTP ROM using the 3-transistor OTP ROM cell shown in FIG. 1 to FIG. 4 according to an embodiment of the present invention.

FIG. 6 is a circuit diagram showing the construction of an OTP ROM according to an embodiment of the present invention.

As shown in FIG. 6, the OTP ROM has an array structure using the 3-transistor OTP ROM cell according to the present invention.

More specially, the OTP ROM includes the X number of bit lines $BL_0$, $BL_1$, . . . , $BL_X$, the X number of word lines $WL_0$, $WL_1$, . . . , $WL_X$, the $X^2$ number of 3-transistor OTP ROM cells $CELL_{00}$, $CELL_{01}$, . . . , $CELL_{XX}$, and the X number of mode control and current sensors 600 to 60X.

The interconnection relationship among them will now be described.

A first input terminal of each OTP ROM cell CELL is connected to a bit line BL and a second input terminal is connected to a word line WL. Furthermore, a third input terminal of each OTP ROM cell CELL is connected to a power supply input terminal 603.

The mode control and current sensors 600 to 60X are connected to the bit line BL, respectively, and each serve to control a value applied to the bit line BL according to a mode control signal PGM/(READ) and a bit line select signal $BLS_X$. Moreover, each of the mode control and current sensors 600 to 60X includes a bit-line sense amplifier for sensing whether the current flows into a corresponding bit line BL in the READ mode and serves to output a value of the bit-line sense amplifier to the outside. Detailed construction and operation of the mode control and current sensors 600 to 60X will be explained later on.

According to an embodiment of the present invention, as shown in FIG. 6, the OTP ROM may further include a blocking resistor $R_{BLOCKING}$ connected between the common high voltage terminal of the antifuse transistor and the power supply input terminal 603. The blocking resistor $R_{BLOCKING}$ serves to prevent a high voltage for programming from being applied to the drain terminal of the high-voltage blocking transistor when resistance components of the broken antifuse transistor are very small.

In an embodiment of the present invention, it has been implemented that the bit-line sense amplifier is included in the mode control and current sensors 600 to 60X, as shown in FIG. 6. It is, however, to be noted that a bit-line sense amplifier and a mode controller can be additionally implemented according to an embodiment.

The operation of the OTP ROM shown in FIG. 6 will now be described in detail.

Hereinafter, it is assumed that a cell to be programmed (i.e., a cell that will break gate oxide of the antifuse transistor) is referred to as "selected cell" and the remaining cells are referred to as "non-selected cell". Furthermore, it is assumed that a cell $CELL_{00}$ is selected and the remaining cells are not selected.

In order to apply a high voltage to both ends of the antifuse transistor of the cell $CELL_{00}$, a logical state 1 is applied to $WL_0$ and a logical state 0 is applied to $BL_0$. In this case, the cell access transistor and the high-voltage blocking transistor in the cell $CELL_{00}$ become conductive and a high voltage is thus applied to both ends of the antifuse transistor. Therefore, the antifuse transistor is broken and a programming current thus flows into the antifuse transistor, the high-voltage blocking transistor and the cell access transistor.

The broken antifuse transistor has a characteristic similar to a resistor permanently. This resistor is referred to as "$R_{ON}$" in the following description. When $R_{ON}$ is very small, if a high voltage is applied to the drain of the high-voltage blocking transistor, there is the possibility that the junction between the drain of the high-voltage blocking transistor and a P-substrate can be broken. In this case, since a very high current flows between the drain of the high-voltage blocking transistor and the P-substrate, resistance properties of the antifuse transistor are degraded. Furthermore, there is a danger that device characteristics of a selected cell may be degraded. Accordingly, if the blocking resistor $R_{BLOCKING}$ is serially connected between the common high voltage terminal C-HV and the power supply input terminal 603, a high voltage can be prevented from being applied to the drain of the high-voltage blocking transistor.

Non-selected cells can be mainly classified into two types: non-selected and unbroken antifuse cells and non-selected and already broken antifuse cells.

In case of the non-selected and unbroken antifuse cells, there is a case where the following logical states are applied to the word line WL and the bit line BL.

1 WL=logical state 1, BL=logical state 0
2 WL=logical state 0, BL=logical state 1
3 WL=logical state 0, BL=logical state 0

In the above, in the first case, a high voltage is applied to the gate of the antifuse transistor. Thus, Fowler-Nordheim (F-N) tunneling current flows from the common high voltage terminal C-HV of the antifuse transistor to the control terminal CTRL through a gate insulator. The voltage applied to the drain of the high-voltage blocking transistor is increased due to the F-N tunneling current. Thereby, if the voltage applied to the drain of the high-voltage blocking transistor becomes higher than that applied to the gate thereof, the high-voltage blocking transistor is turned off and GIDL (Gate-Induced-Drain-Leakage) current flows from the drain of the high-voltage blocking transistor to the P-substrate.

The F-N tunneling current of the antifuse transistor and the GIDL current of the high-voltage blocking transistor become an equilibrium state. Also, the voltage at the drain terminal of the high-voltage blocking transistor becomes higher than $V_{DD}$. Therefore, since the voltage applied to both ends of the antifuse transistor is very lower than the breakdown voltage of the antifuse transistor, the antifuse transistor is unbroken.

The second and third cases are the same as the first case. In these cases, the cell access transistor is turned off. Since the source terminal of the high-voltage blocking transistor is floated, the current does not flow from the drain of the high-voltage blocking transistor to the source thereof and an equilibrium state is established between the two currents. Thus, the antifuse transistor is unbroken in the non-selected cells.

Antifuse cells that are already broken will be described.

As an already-broken antifuse transistor has the similar characteristic as the resistor, a high voltage for programming is directly applied to the drain terminal of the high-voltage blocking transistor. Even in this case, the high-voltage blocking transistor is turned off and only the GIDL current flows in a high voltage blocking frequency, like the above. Here, in the case where the high-voltage blocking transistor is not used but the cell access transistor is directly used, if the gate terminal becomes a logical state 0, the cell access transistor can be broken since a high voltage is applied between the drain and the gate. Therefore, it is preferred that a high-voltage blocking transistor having a gate terminal to which over a common operating voltage $V_{DD}$ is always applied is included.

As a result, although a high voltage is applied to the drain of the high-voltage blocking transistor, an OTP ROM cell that can withstand even a high voltage can be implemented with a device used in a low-voltage process due to a difference as high as a voltage applied to the gate between the drain and the gate.

An exemplary operation of the 3-transistor OTP ROM according to an embodiment of the present invention is shown in Table 1.

TABLE 1

| Mode | First Input Terminal (Input/Output) | Second Input Terminal(Input) | OTP ROM cell | Third Input Terminal |
|---|---|---|---|---|
| PGM Mode | 0 V (Input) | $V_{DC}$ | Selected cell | $V_{PP}$ |
| | 0 V (Input) | 0 V | Non-selected cell | |
| | $V_{DD}$ (Input) | $V_{DC}$ | | |
| | $V_{DD}$ (Input) | | | |
| READ Mode | $V_{DD}$ (Output) | 0 V | Broken cell | $V_{DD}$ |
| | 0 V (Output) | $V_{DC}$ | Unbroken cell | |

As can be seen from Table 1, in the PGM mode, the 3-transistor OTP ROM can be programmed by controlling the voltage applied to the first and second input terminals in a state where the high voltage $V_{PP}$ is applied to the third input terminal.

In other words, 0V and $V_{DD}$ are applied to the first and second input terminals of the selected cell, respectively, and (0V, 0V) and ($V_{DD}$, 0) and ($V_{DD}$,$V_{DD}$) are each applied to (the first input terminal, the second input terminal) of the non-selected cell. Thus, only the antifuse transistor of the selected cell is broken.

In the READ mode, the common operating voltage $V_{DD}$ is applied to the third input terminal. Also, the mode control and current sensor serves to sense the current flowing into the first input terminal using the bit-line sense amplifier and to output the sensed value to the outside. That is, the mode control and current sensor outputs $V_{DD}$ if the current is sensed and outputs 0V if the current is not sensed. It is thus possible to read a value programmed in the ROM.

Figure 7:
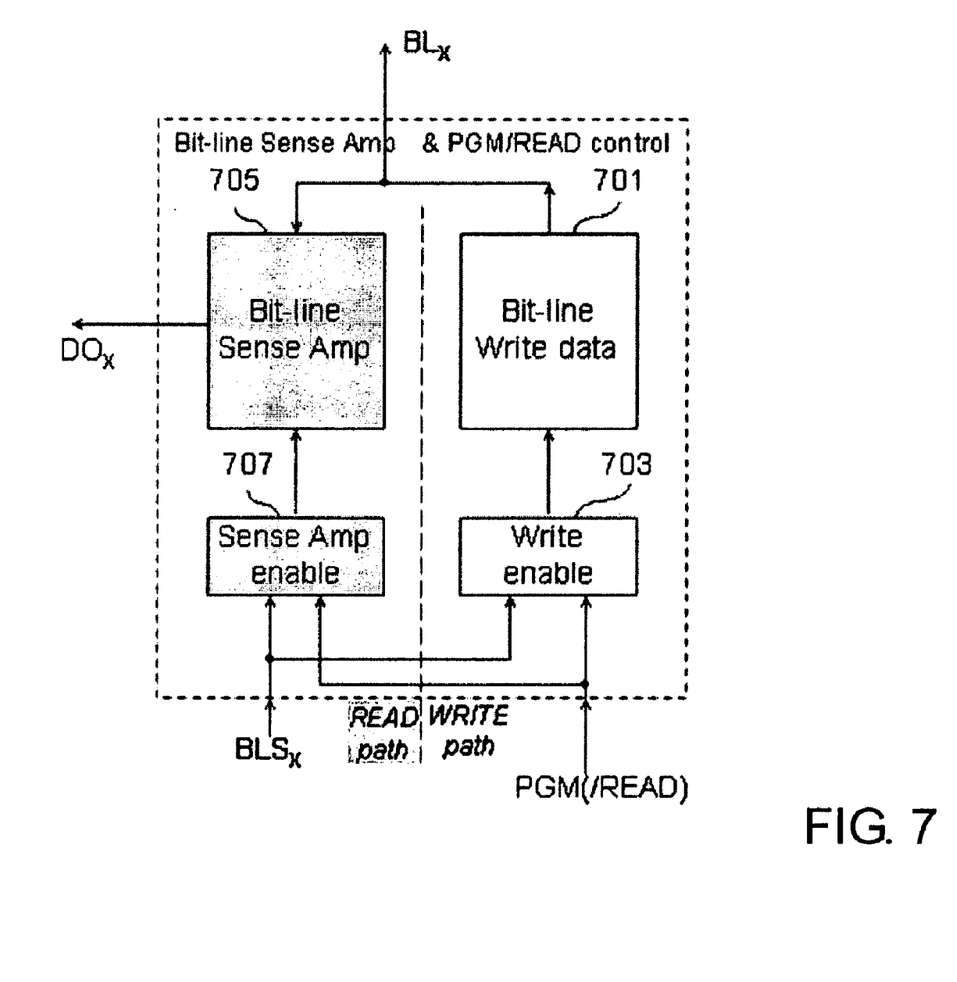
FIG. 7 is a block diagram showing a mode control and current sensor in the OTP ROM shown in FIG. 6.

FIG. 7 is a block diagram showing a detailed construction of the mode control and current sensor in the OTP ROM shown in FIG. 6.

Referring to FIG. 7, the mode control and current sensor includes a bit line data write unit 701, a write enabler 703, a bit line bit-line sense amplifier 705 and a sense amplifier enabler 707.

The bit-line data write unit 701 applies a value to the bit line $BL_X$ in the PGM mode. The value applied to the bit line $BL_X$ is listed in Table 1.

The bit-line sense amplifier 705 senses the current flowing into the bit line $BL_X$ and outputs the sensed value as a logical state 0 or 1 in the READ mode.

The write enabler 703 activates the bit-line data write unit 701 and writes data into the selected bit line, according to the bit line select signal $BLS_X$ and the mode control signal PGM/(READ) in the PGM mode.

The sense amplifier enabler 707 activates the bit-line sense amplifier 705 and senses the current flowing into a corresponding bit line, according to the bit line select signal $BLS_X$ and the mode control signal PGM/(READ) in the READ mode.

Therefore, the mode control and current sensor can program the OTP ROM by applying a proper value to a corresponding bit line in the PGM mode. Further, the mode control and current sensor can read data stored in the ROM by sensing the current flowing into a corresponding bit line in the READ mode.

Figure 8:
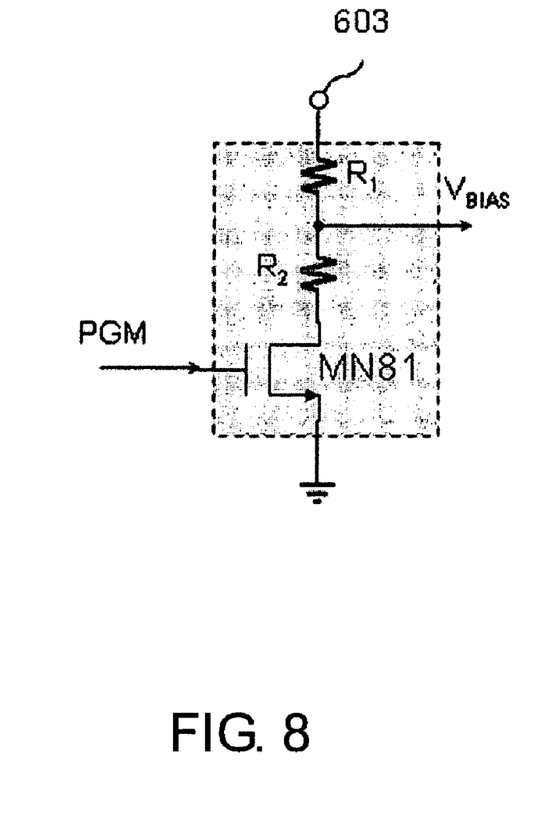
FIG. 8 shows a bias circuit for increasing reliability of a high-voltage blocking transistor in a PGM mode in the OTP ROM shown in FIG. 6 according to an embodiment of the present invention.

FIG. 8 shows a bias circuit for increasing reliability of the high-voltage blocking transistor in the PGM mode in the OTP ROM shown in FIG. 6 according to an embodiment of the present invention.

In the aforementioned embodiments, it has been described that the common operating voltage $V_{DD}$ is always applied to the gate of the high-voltage blocking transistor. In this case, however, there is a problem that the high-voltage blocking transistor is broken in the PGM mode. In the concrete, in a non-selected and unbrokwn antifuse cell, the high voltage $V_{PP}$ is directly applied to the drain of the high-voltage blocking transistor. At this time, a voltage difference between the drain and gate of the high-voltage blocking transistor becomes $V_{PP}$–$V_{DD}$. If a program is performed for a long time with the $V_{PP}$–$V_{DD}$ value kept, there is a problem that a gate insulator of the high-voltage blocking transistor is broken. Therefore, in order to prevent it, the voltage applied to the gate of the high-voltage blocking transistor is set higher than the common operating voltage $V_{DD}$ during the programming, thus reducing a voltage difference between the grain and drain. Reliability of the OTP ROM is thus increased. According to an experimental result, it is preferred that the bias voltage $V_{BIAS}$ applied to the gate of the high-voltage blocking transistor is about 0.5$V_{PP}$.

The construction and operation of the bias circuit according to an embodiment of the present invention will now be described.

Referring to FIG. 8, the bias circuit includes a NMOS transistor MN81, and first and second resistors R1 and R2. The NMOS transistor MN81 has a gate to which a PGM signal for programming is applied, a drain connected to one end of the second resistor R2, and a source grounded. The other end of the second resistor R2 is connected to one end of the first resistor R1 to form the output terminal $V_{BIAS}$ of the bias circuit, and the other end of the first resistor R1 is connected to the power supply input terminal 603.

Through this construction, in the PGM mode, the third input terminal of the OTP ROM is supplied with the high voltage $V_{PP}$ for breaking the antifuse transistor, and the gate of the high-voltage blocking transistor is supplied with the bias voltage $V_{BIAS}$, thus preventing the high-voltage blocking transistor from breaking.

$$V_{BIAS} = \frac{R_2}{R_1 + R_2} \times V_{FF} \qquad \text{[Equation 1]}$$

Table 2 lists the bias voltage $V_{BIAS}$ applied to the gate of the high-voltage blocking transistor in the OTP ROM according to an embodiment of the present invention.

TABLE 2

| | PGM Mode | READ Mode |
|---|---|---|
| Power Supply Input Terminal (603) | $V_{PP}$ | $V_{DD}$ |
| Input $V_{BIAS}$ for common reliability | $V_{DD}$ | $V_{DD}$ |
| Input $V_{BIAS}$ for high reliability | $(R_2/(R_1 + R_2)) \times V_{PP}$ | $V_{DD}$ |

As can be seen from Table 2, in the OTP ROM, if common reliability is required, the bias voltage applied to the high-voltage blocking transistor maintains the common operating voltage $V_{DD}$. If high reliability is required, it is preferred that the bias circuit shown in FIG. 8 is included and a voltage higher than that in the PGM mode is applied.

Figure 9:
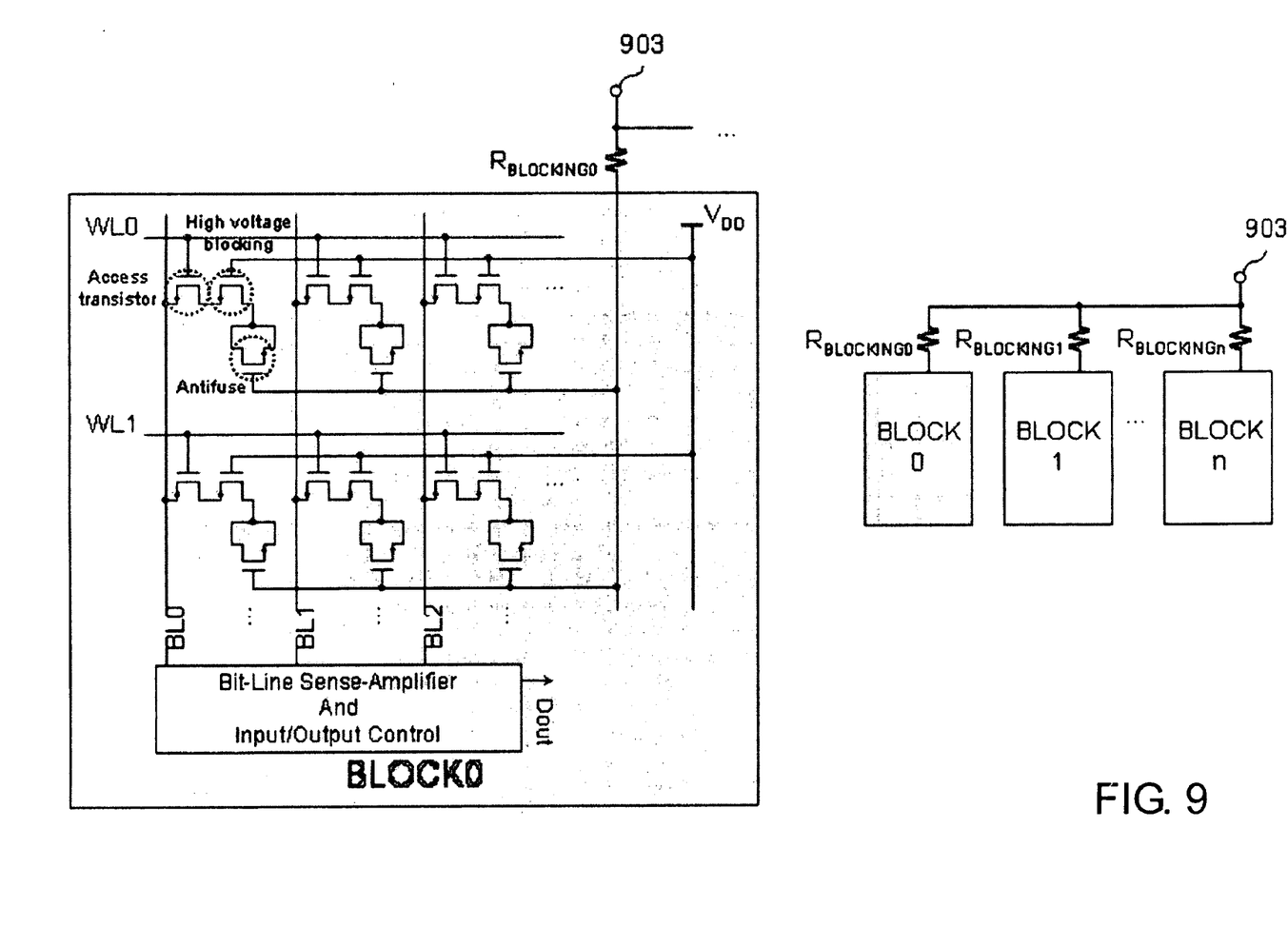
FIG. 9 shows the structure of the OTP ROM for higher-integration according to an embodiment of the present invention.

FIG. 9 shows the structure of the OTP ROM for higher-integration according to an embodiment of the present invention.

The level of integration in the 3-transistor OTP ROM is determined according to the blocking resistor $R_{BLOCKING}$ and the GIDL current of the non-selected and unbroken antifuse cell. In particular, in programming a ROM of a large capacity, a large amount of GIDL current flows into the blocking resistor $R_{BLOCKING}$. This causes a voltage in the gate terminal of the antifuse transistor to drop. Thereby, the voltage in the gate terminal of the antifuse transistor is reduced below a voltage to break the antifuse transistor. In this case, it is impossible to program the ROM. Therefore, the capacity of the ROM that can be programmed by maximum is limited.

According to an embodiment of the present invention, as shown in FIG. 9, unit blocks that can be programmed individually are connected to a power supply input unit 903 through a blocking resistor $R_{BLOCKING}$ and a high voltage $V_{PP}$ for programming by each unit block is applied to the power supply input unit 903. Thus, it is possible to solve program trouble due to GIDL current and $R_{BLOCKING}$ and to implement a high-density integration a CMOS gate-antifuse OTP ROM.

According to the present invention, it is possible to implement an OTP ROM without an additional process in a standard CMOS process.

Further, it is possible to implement an OTP ROM that can obtain uniform breakdown voltage properties.

Moreover, it is possible to implement an OTP ROM with only a low-voltage device without a process for additional high voltage.

Incidentally, it is possible to implement an OTP ROM that can be higher integrated using an array structure.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An OTP ROM cell having a first input terminal, a second input terminal and a third input terminal, wherein the OTP ROM stores data by means of a voltage applied to the first to third input terminals, the OTP ROM cell comprising:
   a cell access transistor having a gate forming the second input terminal, a drain and a source forming the first input terminal, wherein the cell access transistor is activated by a voltage applied to between the gate and source;
   a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and
   an antifuse transistor having a gate forming the third input terminal, and a source and a drain which are connected to each other and are then connected to the drain of the high-voltage blocking transistor, wherein a high voltage is applied to the third input terminal and if the cell access transistor is activated, gate oxide is broken and shorted.

2. An OTP ROM cell having a first input terminal, a second input terminal and a third input terminal, wherein the OTP ROM stores data by means of a voltage applied to the first to third input terminals, the OTP ROM cell comprising:
   a cell access transistor having a gate forming the second input terminal, a drain and a source forming the first input terminal, wherein the cell access transistor is activated by a voltage applied to between the gate and source;
   a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and
   an antifuse transistor having a gate forming the third input terminal, a drain and a source, one of the source and the drain being connected to the drain of the high-voltage blocking transistor and the other of the source and the drain being floated, wherein a high voltage is applied to the third input terminal and if the cell access transistor is activated, gate oxide is broken and shorted.

3. An OTP ROM cell having a first input terminal, a second input terminal and a third input terminal, wherein the OTP ROM stores data by means of a voltage applied to the first to third input terminals, the OTP ROM cell comprising:
   a cell access transistor having a gate forming the second input terminal, a drain and a source forming the first input terminal, wherein the cell access transistor is activated by a voltage applied to between the gate and source;
   a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and
   an antifuse transistor having a gate connected to the drain of the high-voltage blocking transistor, and a source and a drain which are connected to each other to form the third input terminal, wherein a high voltage is applied to the third input terminal and if the cell access transistor is activated, gate oxide is broken and shorted.

4. An OTP ROM cell having a first input terminal, a second input terminal and a third input terminal, wherein the OTP ROM stores data by means of a voltage applied to the first to third input terminals, the OTP ROM cell comprising:
   a cell access transistor having a gate forming the second input terminal, a drain and a source forming the first input terminal, wherein the cell access transistor is activated by a voltage applied to the gate and source;

a high-voltage blocking transistor having a gate, a drain and a source connected to the drain of the cell access transistor, wherein the high-voltage blocking transistor allows the current to flow from the drain to the source by means of a bias voltage applied to the gate, thus blocking the high voltage applied to the third input terminal from being directly applied to the cell access transistor; and an antifuse transistor having a gate connected to the drain of the high-voltage blocking transistor, a drain and a source, one of the source and drain forming the third input terminal and the other of the source and drain being floated, wherein a high voltage is applied to the third input terminal and if the cell access transistor is activated, gate oxide is broken and shorted.

5. The OTP ROM cell as claimed in claim 1, wherein the antifuse transistor is implemented with an nMOS transistor.

6. The OTP ROM cell as claimed in claim 2, wherein the antifuse transistor is implemented with an nMOS transistor.

7. The OTP ROM cell as claimed in claim 3, wherein the antifuse transistor is implemented with a PMOS transistor.

8. The OTP ROM cell as claimed in claim 4, wherein the antifuse transistor is implemented with a pMOS transistor.

9. The OTP ROM cell as claimed in claim 1, further comprising a sense amplifier for sensing the current flowing into the first input terminal.

10. The OTP ROM cell as claimed in claim 2, further comprising a sense amplifier for sensing the current flowing into the first input terminal.

11. The OTP ROM cell as claimed in claim 3, further comprising a sense amplifier for sensing the current flowing into the first input terminal.

12. The OTP ROM cell as claimed in claim 4, further comprising a sense amplifier for sensing the current flowing into the first input terminal.

13. The OTP ROM cell as claimed in claim 1, wherein a power supply input unit for applying a high voltage when data is stored and applying a common operating voltage when recorded data is read, is connected to the third input terminal.

14. The OTP ROM cell as claimed in claim 2, wherein a power supply input unit for applying a high voltage when data is stored and applying a common operating voltage when recorded data is read, is connected to the third input terminal.

15. The OTP ROM cell as claimed in claim 3, wherein a power supply input unit for applying a high voltage when data is stored and applying a common operating voltage when recorded data is read, is connected to the third input terminal.

16. The OTP ROM cell as claimed in claim 4, wherein a power supply input unit for applying a high voltage when data is stored and applying a common operating voltage when recorded data is read, is connected to the third input terminal.

17. The OTP ROM cell as claimed in claim 1, wherein a bias circuit for applying a voltage higher than a common operating voltage when data is stored and applying the common operating voltage when recorded data is read, is connected to the gate of the high-voltage blocking transistor.

18. The OTP ROM cell as claimed in claim 2, wherein a bias circuit for applying a voltage higher than a common operating voltage when data is stored and applying the common operating voltage when recorded data is read, is connected to the gate of the high-voltage blocking transistor.

19. The OTP ROM cell as claimed in claim 3, wherein a bias circuit for applying a voltage higher than a common operating voltage when data is stored and applying the common operating voltage when recorded data is read, is connected to the gate of the high-voltage blocking transistor.

20. The OTP ROM cell as claimed in claim 4, wherein a bias circuit for applying a voltage higher than a common operating voltage when data is stored and applying the common operating voltage when recorded data is read, is connected to the gate of the high-voltage blocking transistor.

21. The OTP ROM cell as claimed in claim 1, wherein the bias circuit comprises a transistor, and first and second resistors, wherein a voltage for activating the transistor is applied to a gate of the transistor if data is stored in the OTP ROM cell, a drain of the transistor is connected to one end of the second resistor, a source of the transistor is grounded, the other end of the second resistor is connected to one end of the first resistor to form an output terminal, and the other end of the first resistor is connected to the power supply.

22. The OTP ROM cell as claimed in claim 2, wherein the bias circuit comprises a transistor, and first and second resistors, wherein a voltage for activating the transistor is applied to a gate of the transistor if data is stored in the OTP ROM cell, a drain of the transistor is connected to one end of the second resistor, a source of the transistor is grounded, the other end of the second resistor is connected to one end of the first resistor to form an output terminal, and the other end of the first resistor is connected to the power supply.

23. The OTP ROM cell as claimed in claim 3, wherein the bias circuit comprises a transistor, and first and second resistors, wherein a voltage for activating the transistor is applied to a gate of the transistor if data is stored in the OTP ROM cell, a drain of the transistor is connected to one end of the second resistor, a source of the transistor is grounded, the other end of the second resistor is connected to one end of the first resistor to form an output terminal, and the other end of the first resistor is connected to the power supply.

24. The OTP ROM cell as claimed in claim 4, wherein the bias circuit comprises a transistor, and first and second resistors, wherein a voltage for activating the transistor is applied to a gate of the transistor if data is stored in the OTP ROM cell, a drain of the transistor is connected to one end of the second resistor, a source of the transistor is grounded, the other end of the second resistor is connected to one end of the first resistor to form an output terminal, and the other end of the first resistor is connected to the power supply.

25. An OTP ROM, wherein an OTP ROM cell according to claim 1 is used in plural to form an array structure, wherein a first input terminal of the OTP ROM cell is connected to a bit line, a second input terminal of the OTP ROM cell is connected to a word line, a third input terminal of the OTP ROM cell is connected to a power supply input terminal for applying a high voltage or a common operating voltage, whereby a voltage applied to the bit line, the word line, and the power supply input terminal is controlled to store data or read stored data.

26. An OTP ROM, wherein an OTP ROM cell according to claim 2 is used in plural to form an array structure, wherein a first input terminal of the OTP ROM cell is connected to a bit line, a second input terminal of the OTP ROM cell is connected to a word line, a third input terminal of the OTP ROM cell is connected to a power supply input terminal for applying a high voltage or a common operating voltage, whereby a voltage applied to the bit line, the word line, and the power supply input terminal is controlled to store data or read stored data.

27. An OTP ROM, wherein an OTP ROM cell according to claim 3 is used in plural to form an array structure, wherein a first input terminal of the OTP ROM cell is connected to a bit line, a second input terminal of the OTP ROM cell is connected to a word line, a third input terminal of the OTP ROM cell is connected to a power supply input terminal for applying a high voltage or a common operating voltage, whereby a voltage applied to the bit line, the word line, and the power supply input terminal is controlled to store data or read stored data.

28. An OTP ROM, wherein an OTP ROM cell according to claim 4 is used in plural to form an array structure, wherein a first input terminal of the OTP ROM cell is connected to a bit line, a second input terminal of the OTP ROM cell is connected to a word line, a third input terminal of the OTP ROM cell is connected to a power supply input terminal for applying a high voltage or a common operating voltage, whereby a voltage applied to the bit line, the word line, and the power supply input terminal is controlled to store data or read stored data.

29. The OTP ROM as claimed in claim 25, further comprising a blocking resistor connected between the third input terminal and the power supply input terminal.

30. The OTP ROM as claimed in claim 26, further comprising a blocking resistor connected between the third input terminal and the power supply input terminal.

31. The OTP ROM as claimed in claim 27, further comprising a blocking resistor connected between the third input terminal and the power supply input terminal.

32. The OTP ROM as claimed in claim 28, further comprising a blocking resistor connected between the third input terminal and the power supply input terminal.

33. The OTP ROM as claimed in claim 25, further comprising a mode control and current sensor connected to the bit line, for controlling a value applied to the bit line according to a mode control signal and a bit line select signal applied thereto and sensing whether the current flows into the bit line if stored data is read.

34. The OTP ROM as claimed in claim 26, further comprising a mode control and current sensor connected to the bit line, for controlling a value applied to the bit line according to a mode control signal and a bit line select signal applied thereto and sensing whether the current flows into the bit line if stored data is read.

35. The OTP ROM as claimed in claim 27, further comprising a mode control and current sensor connected to the bit line, for controlling a value applied to the bit line according to a mode control signal and a bit line select signal applied thereto and sensing whether the current flows into the bit line if stored data is read.

36. The OTP ROM as claimed in claim 28, further comprising a mode control and current sensor connected to the bit line, for controlling a value applied to the bit line according to a mode control signal and a bit line select signal applied thereto and sensing whether the current flows into the bit line if stored data is read.

37. The OTP ROM as claimed in claim 33, wherein the mode control and current sensor comprises:

a bit-line data write unit for applying a proper voltage to a selected bit line if data is stored;

an write enabler for activating the bit-line data write unit according to the bit line select signal and the mode control signal, if data is stored;

a bit-line sense amplifier for sensing the current flowing into the bit line if data is read; and a sense amplifier enabler for activating the bit-line sense amplifier according to the bit line select signal and the mode control signal, if data is read.

38. The OTP ROM as claimed in claim 34, wherein the mode control and current sensor comprises:

a bit-line data write unit for applying a proper voltage to a selected bit line if data is stored;

an write enabler for activating the bit-line data write unit according to the bit line select signal and the mode control signal, if data is stored;

a bit-line sense amplifier for sensing the current flowing into the bit line if data is read; and a sense amplifier enabler for activating the bit-line sense amplifier according to the bit line select signal and the mode control signal, if data is read.

39. The OTP ROM as claimed in claim 35, wherein the mode control and current sensor comprises:

a bit-line data write unit for applying a proper voltage to a selected bit line if data is stored;

an write enabler for activating the bit-line data write unit according to the bit line select signal and the mode control signal, if data is stored;

a bit-line sense amplifier for sensing the current flowing into the bit line if data is read; and a sense amplifier enabler for activating the bit-line sense amplifier according to the bit line select signal and the mode control signal, if data is read.

40. The OTP ROM as claimed in claim 36, wherein the mode control and current sensor comprises:

a bit-line data write unit for applying a proper voltage to a selected bit line if data is stored;

an write enabler for activating the bit-line data write unit according to the bit line select signal and the mode control signal, if data is stored;

a bit-line sense amplifier for sensing the current flowing into the bit line if data is read; and a sense amplifier enabler for activating the bit-line sense amplifier according to the bit line select signal and the mode control signal, if data is read.

* * * * *